United States Patent
Lue

(10) Patent No.: US 10,916,308 B2
(45) Date of Patent: Feb. 9, 2021

(54) 3D FLASH MEMORY MODULE AND HEALING AND OPERATING METHODS OF 3D FLASH MEMORY

(71) Applicant: MACRONIX International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/784,154

(22) Filed: Feb. 6, 2020

(65) Prior Publication Data

US 2020/0381050 A1 Dec. 3, 2020

Related U.S. Application Data

(60) Provisional application No. 62/856,159, filed on Jun. 3, 2019.

(51) Int. Cl.
*G11C 16/14* (2006.01)
*G11C 16/04* (2006.01)
*G11C 5/02* (2006.01)

(52) U.S. Cl.
CPC .......... *G11C 16/0483* (2013.01); *G11C 5/025* (2013.01); *G11C 16/14* (2013.01)

(58) Field of Classification Search
CPC ...... G11C 16/14; G11C 5/025; G11C 16/0483

USPC ..................................................... 365/185.17
See application file for complete search history.

(56) References Cited

U.S. PATENT DOCUMENTS

| | | | |
|---|---|---|---|
| 8,193,573 B2 * | 6/2012 | Bronner | G11C 16/3418 257/314 |
| 8,203,187 B2 * | 6/2012 | Lung | G11C 16/0458 257/390 |
| 8,488,387 B2 | 7/2013 | Lue et al. | |
| 8,824,212 B2 | 9/2014 | Lue | |
| 9,378,832 B1 * | 6/2016 | Lu | G11C 16/16 |
| 2010/0230807 A1 * | 9/2010 | Bronner | H01L 23/345 257/734 |
| 2010/0265773 A1 * | 10/2010 | Lung | H01L 27/11582 365/185.27 |
| 2016/0172044 A1 * | 6/2016 | Lu | G11C 16/3431 365/185.11 |

* cited by examiner

*Primary Examiner* — Xiaochun L Chen
(74) *Attorney, Agent, or Firm* — J.C. Patents

(57) ABSTRACT

A three-dimensional (3D) flash memory module, a healing method of 3D flash memory, and an operating method of 3D flash memory are provided. The 3D flash memory module includes a 3D flash memory structure and a conductive layer. The 3D flash memory structure is disposed on a substrate. The conductive layer is disposed on the substrate and is adjacent to at least one side wall of the 3D flash memory structure. The conductive layer extends along the at least one side wall of the 3D flash memory structure, and each of two opposite end portions of the conductive layer has an electrical connection point in an extending direction of the conductive layer.

16 Claims, 1 Drawing Sheet

3D FLASH MEMORY MODULE AND HEALING AND OPERATING METHODS OF 3D FLASH MEMORY

CROSS-REFERENCE TO RELATED APPLICATION

This application claims the priority benefit of U.S. provisional application Ser. No. 62/856,159, filed on Jun. 3, 2019. The entirety of the above-mentioned patent application is hereby incorporated by reference herein and made a part of this specification.

BACKGROUND

Technical Field

The disclosure relates to a memory module and an operating method of memory. More particularly, the disclosure relates to a three-dimensional (3D) flash memory module and a healing method of 3D flash memory.

Description of Related Art

Owing to advantages such as capabilities of retaining stored data after power supply is cut off, the non-volatile memory (e.g., the flash memory) has become a memory device that has been widely adopted by personal computers and other electronic apparatuses.

At present, the flash memory types commonly used in the field include the NOR-type flash memory and the NAND-type flash memory. Generally, performance of the flash memory is significantly reduced after multiple operations, so that a healing operation may be performed to the flash memory. Such healing operation may be performed through, for example, a heating operation performed to the flash memory by a heater, so as to heal the electric charge storage structure (e.g., a nitride layer) in the flash memory. In the current technology, the word lines act as the heater most of the time. Nevertheless, the number of the word lines is great, and arrangement between the word lines and other devices (e.g., a word line decoder) is relatively complicated, as such, layout of the flash memory structure may not be easily designed.

SUMMARY

The disclosure provides a three-dimensional (3D) flash memory module having a conductive layer acting as a heater and adjacent to a side wall of a 3D flash memory structure.

The disclosure provides a healing method of 3D flash memory capable of performing healing by treating a conductive layer adjacent to a side wall of a 3D flash memory structure as a heater.

The disclosure provides an operating method of 3D flash memory capable of performing an operation through applying a source voltage to a source of a 3D flash memory structure by using a conductive layer adjacent to a side wall of the 3D flash memory structure.

In an embodiment of the disclosure, a 3D flash memory module includes a 3D flash memory structure and a conductive layer. The 3D flash memory structure is disposed on a substrate. The conductive layer is disposed on the substrate and is adjacent to at least one side wall of the 3D flash memory structure. The conductive layer extends along the at least one side wall of the 3D flash memory structure, and each of two opposite end portions of the conductive layer has an electrical connection point in an extending direction of the conductive layer.

In the 3D flash memory module provided by an embodiment of the disclosure, the 3D flash memory structure is a 3D AND memory structure.

In the 3D flash memory module provided by an embodiment of the disclosure, the conductive layer is not electrically connected to the 3D AND memory structure.

In the 3D flash memory module provided by an embodiment of the disclosure, the 3D flash memory structure is a 3D NAND memory structure.

In the 3D flash memory module provided by an embodiment of the disclosure, the conductive layer is electrically connected to a source of the 3D NAND memory structure.

In the 3D flash memory module provided by an embodiment of the disclosure, the conductive layer includes a plurality of discontinuous conductive portions, and the plurality of discontinuous conductive portions are individually disposed on the substrate along the at least one side wall of the 3D flash memory structure. Each of two opposite end portions of each of the conductive portions has an electrical connection point in the extending direction.

In the 3D flash memory module provided by an embodiment of the disclosure, a length of each of the conductive portions is less than or equal to 50 m.

In the 3D flash memory module provided by an embodiment of the disclosure, a distance between the conductive portions is less than 20% of a length of the conductive portions.

In the 3D flash memory module provided by an embodiment of the disclosure, the conductive portions around the 3D flash memory structure are electrically connected to each other.

In the 3D flash memory module provided by an embodiment of the disclosure, the conductive layer includes a metal layer.

In the 3D flash memory module provided by an embodiment of the disclosure, the conductive layer includes a tungsten layer.

In an embodiment of the disclosure, a healing method of 3D flash memory is adapted to the 3D flash memory module, and the method includes the following steps. A relatively high voltage and a relatively low voltage are respectively applied to the electrical connection points of the two end portions of the conductive layer to form a voltage difference. The temperature of the 3D flash memory structure is raised to a specific temperature by heat generated by the conductive layer owing to the voltage difference, wherein the specific temperature is above 700 K.

In the healing method of 3D flash memory provided by an embodiment of the disclosure, the specific temperature is above 1000K.

In the healing method of 3D flash memory provided by an embodiment of the disclosure, the voltage difference is 4 V or more.

In an embodiment of the disclosure, an operating method of 3D flash memory is adapted to the 3D flash memory module, and the method includes the following steps. A source voltage is applied to the source by applying a voltage to the conductive layer when a program operation, a read operation or an erase operation is performed to the 3D flash memory structure. The step of applying a voltage to the conductive layer includes applying a relatively high voltage and a relatively low voltage respectively to the electrical connection points of the two end portions of the conductive layer.

In the operating method of 3D flash memory provided by an embodiment of the disclosure, a voltage difference between the relatively high voltage and the relatively low voltage is 4 V or more.

In view of the above, in the 3D flash memory module provided by the disclosure, the conductive layer adjacent to the side wall of the 3D flash memory structure is treated as a heater. As such, the 3D flash memory structure is uniformly heated over a large area. In this way, the 3D flash memory structure is healed, and layout of the 3D flash memory structure may be easily designed. In addition, since the conductive layer acting as a heater is provided in the 3D flash memory module, in the case that the conductive layer also acts as the source line, the 3D flash memory structure may be heated when the program operation or the read operation or the erase operation is performed to the 3D flash memory structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
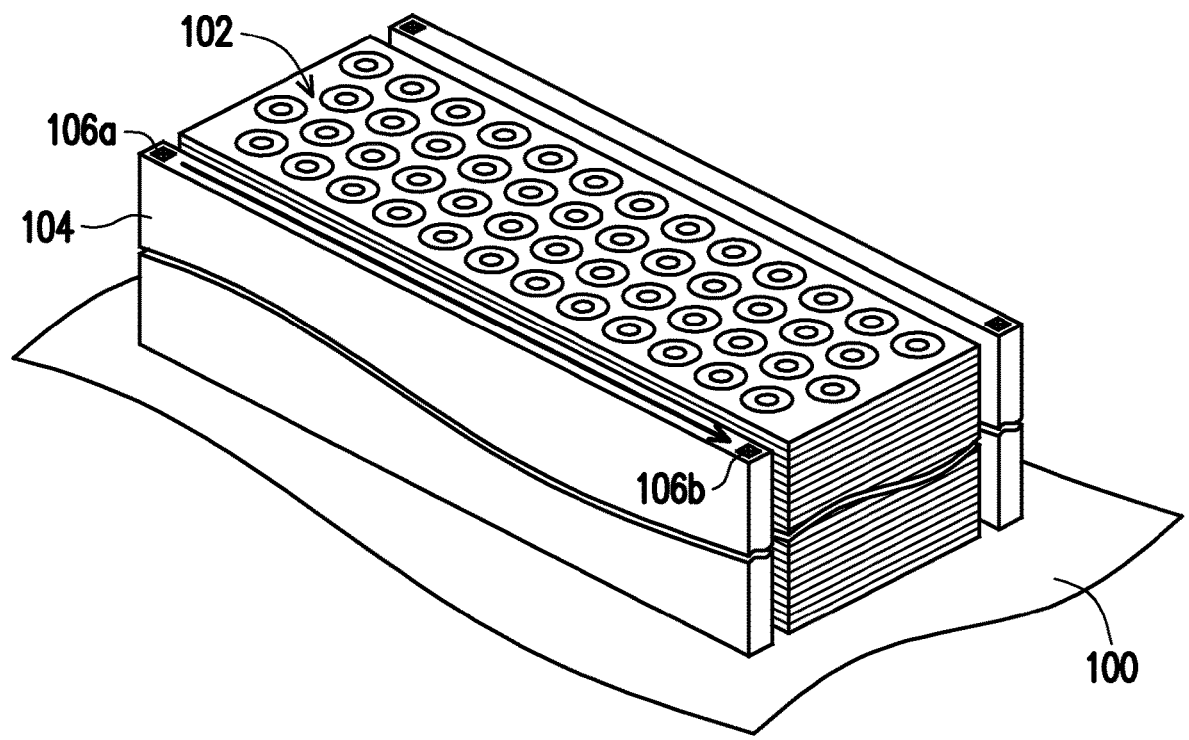
FIG. 1 is a three-dimensional schematic view of a three-dimensional (3D) flash memory module according to an embodiment of the disclosure.

FIG. 1 is a three-dimensional schematic view of a three-dimensional (3D) flash memory module according to an embodiment of the disclosure. In this embodiment, for the sake of clarity and for ease of description, a 3D flash memory structure and a conductive layer acting as a heater are depicted, and the insulating layer, circuit layer, electronic devices, etc. commonly provided on a substrate are omitted.

With reference to FIG. 1, a 3D flash memory module of this embodiment includes a 3D flash memory structure 102 and a conductive layer 104. The 3D flash memory structure 102 and the conductive layer 104 are both disposed on a substrate 100. In this embodiment, the substrate 100 is a dielectric substrate and is, for example, a silicon oxide layer formed on a silicon substrate. In addition, in this embodiment, the 3D flash memory structure 102 is a 3D AND memory structure. In FIG. 1, the 3D AND memory structure is simply depicted, and a detailed structure thereof is known to people having ordinary skill in the art, so description thereof is not additionally provided herein.

The conductive layer 104 is disposed on the substrate 100, is adjacent to a side wall of the 3D flash memory structure 102, and extends along the side wall of the 3D flash memory structure 102. The conductive layer 104 is, for example, a metal layer. For instance, the conductive layer 104 may be a tungsten layer exhibiting favorable conductivity. An insulating layer (not shown) is disposed between the conductive layer 104 and the 3D flash memory structure 102. The insulating layer is, for example, a silicon oxide layer. In addition, in this embodiment, the conductive layer 104 is disposed next to two opposite side walls of the 3D flash memory structure 102, but the disclosure is not limited thereto. In other embodiments, the conductive layer 104 may be disposed next to one side wall of the 3D flash memory structure 102 only according to actual demand. Alternatively, in other embodiments, the conductive layer 104 may be disposed around the 3D flash memory structure 102. The conductive layer 104 next to the side wall of the 3D flash memory structure 102 acts as a heater to perform heating to the 3D flash memory structure 102, and a detailed description is provided as follows.

In this embodiment, a height of the conductive layer 104 and a height of the 3D flash memory structure 102 are substantially identical. That is, a top surface of the conductive layer 104 is coplanar with a top surface of the 3D flash memory structure 102. In this way, the conductive layer 104 may effectively perform heating to the entire 3D flash memory structure 102. In other embodiments, the height of the conductive layer 104 may be greater than the height of the 3D flash memory structure 102, so that the entire 3D flash memory structure 102 is ensured to be heated. Alternatively, according to actual demand, the height of the conductive layer 104 may be less than the height of the 3D flash memory structure 102, so that only part of the 3D flash memory structure 102 is heated.

In this embodiment, a length of the conductive layer 104 in an extending direction of the conductive layer 104 and a length of the side wall of the 3D flash memory structure 102 are substantially identical. That is, edges of two ends of the conductive layer 104 are flushed with edges of two ends of the 3D flash memory structure 102. In this way, the conductive layer 104 may effectively perform heating to the entire 3D flash memory structure 102. In other embodiments, the length of the conductive layer 104 in the extending direction of the conductive layer 104 may be greater than the length of the 3D flash memory structure 102, so that the entire 3D flash memory structure 102 is ensured to be heated. Alternatively, according to actual demand, the length of the conductive layer 104 in the extending direction of the conductive layer 104 may be less than the length of the side wall of the 3D flash memory structure 102, so that only part of the 3D flash memory structure 102 is heated.

In this embodiment, each of two opposite end portions of the conductive layer 104 has an electrical connection point in the extending direction of the conductive layer 104. As shown in FIG. 1, in the extending direction of the conductive layer 104, the left end portion has an electrical connection point 106a, and the right end portion has an electrical connection point 106b. The electrical connection points 106a and 106b may be configured to receive voltages applied by an external device. The electrical connection points 106a and 106b may be the conductive layer 104 itself or may be disposed on a pad of the conductive layer 104, which is not limited by the disclosure.

Since performance of the 3D flash memory structure 102 is significantly reduced after multiple operations, the conductive layer 104 may be configured to act as a heater to perform healing to the 3D flash memory structure 102 in this embodiment. In this embodiment, voltages may be applied to the electrical connection points 106a and 106b respectively, and in this way, the conductive layer 104 acts as a heater. As shown in FIG. 1, a relatively high voltage may be applied to the electrical connection point 106a, and a relatively low voltage may be applied to the electrical connection point 106b, so that a voltage difference is generated. In this way, a current is generated and the generated current passes through the conductive layer 104 in the direction of the arrow. When the current passes through the conductive layer 104, the temperature of the conductive layer 104 is raised to a specific temperature (e.g. above 700 k, preferably above 1000 k) to generates heat and thus performs heating to the adjacent 3D flash memory structure 102 to the specific temperature, so that an electric charge storage structure (e.g., a nitride layer) in the 3D flash memory structure 102 is healed. For example, a voltage of 4 V or more may be applied to the electrical connection point 106a and a voltage of 0 V may be applied to the electrical connection point 106b, so that a voltage difference is generated, and thus the temperature of 3D flash memory structure is raised. In addition, a width of the conductive layer 104 may be adjusted (the amount of current passing through the conductive layer 104 is increased), so that the heating ability of the conductive layer 104 is increased.

In the case that the conductive layer 104 is disposed at two opposite sides of the 3D flash memory structure 102, when an healing operation is performed to the 3D flash memory structure 102, flowing directions of currents at the two sides may be identical to each other (the relatively high voltage is applied to both the electrical connection points 106a or the electrical connection points 106b at the two sides) or may be different from each other (the relatively high voltage is applied to the electrical connection point 106a at one side and the electrical connection point 106b at the other side).

In this embodiment, the conductive layer 104 adjacent to the side wall of the 3D flash memory structure 102 acts as a heater, so that the 3D flash memory structure 102 may be uniformly heated over a large area. In addition, in this embodiment, the conductive layer 104 is simply disposed on the substrate 100 and is adjacent to the side wall of the 3D flash memory structure 102, so that layout of the 3D flash memory structure may be easily designed.

Note that in this embodiment, since the 3D flash memory structure 102 is a 3D AND memory structure, but the disclosure is not limited thereto. In other embodiments, the 3D flash memory structure 102 may be a 3D NAND, and the conductive layer 104 may be disposed to be electrically connected to a source of the 3D flash memory structure 102 so as to act as a source line as well as a heater.

As described above, in the case that healing is to be performed to the 3D flash memory structure 102, the relatively high voltage and the relatively low voltage are applied to the electrical connection point 106a and the electrical connection point 106b respectively, and the voltage difference is thereby generated. In this way, the conductive layer 104 may generate heat to perform healing to the 3D flash memory structure 102. In addition, when a program operation, the read operation or an erase operation is performed to the 3D flash memory structure 102, identical voltages may be applied to both the electrical connection point 106a and the electrical connection point 106b, so that a source voltage is applied to the source of the 3D flash memory structure 102, and that the program operation, the read operation or the erase operation is performed. Alternatively, the relatively high voltage and the relatively low voltage may be applied to the electrical connection point 106a and the electrical connection point 106b respectively, so that heating is performed to the 3D flash memory structure 102 when the program operation, the read operation or the erase operation is performed at the same time. The voltage difference between the relatively high voltage and the relatively low voltage is for example, 4 V or more. In this way, the efficiency of the program operation and the erase operation can be effectively improved, and the read current during the read operation can be effectively improved.

In the case where the conductive layer 104 serves as both a heater and a source line, when performing a program operation, in one embodiment, the bias voltage required for the source line is 0 V. At this time, a voltage of 0 V may be applied to the electrical connection point at one end of the source line, and a voltage of 4 V may be applied to the electrical connection point at the other end to establish a voltage difference of 4 V. In another embodiment, a voltage of +2 V may be applied to the electrical connection point at one end of the source line, and a voltage of −2 V may be applied to the electrical connection point at the other end to establish a voltage difference of 4 V, and the average voltage is 0 V.

In addition, when performing an erase operation, in one embodiment, the bias voltage required for the source line is −18 V. At this time, a voltage of −18 V can be applied to the electrical connection point at one end of the source line, and a voltage of −22 V can be applied to the electrical connection point at the other end to establish a voltage difference of 4 V. In another embodiment, a voltage of −16 V may be applied to the electrical connection point at one end of the source line, and a voltage of −20 V may be applied to the electrical connection point at the other end to establish a voltage difference of 4 V, and the average voltage is −18V.

In addition, when performing a read operation, in one embodiment, the bias voltage required for the source line is 0 V. At this time, a voltage of 0 V may be applied to the electrical connection point at one end of the source line, and a voltage of −4 V may be applied to the electrical connection point at the other end to establish a voltage difference of 4 V. In another embodiment, a voltage of +2 V may be applied to the electrical connection point at one end of the source line, and a voltage of −2 V may be applied to the electrical connection point at the other end to establish a voltage difference of 4 V, and the average voltage is 0 V.

In this embodiment, the conductive layer 104 has a continuous structure in the extending direction thereof, but the disclosure is not limited thereto. In other embodiments, the conductive layer 104 may has a discontinuous structure in the extending direction thereof.

Figure 2:
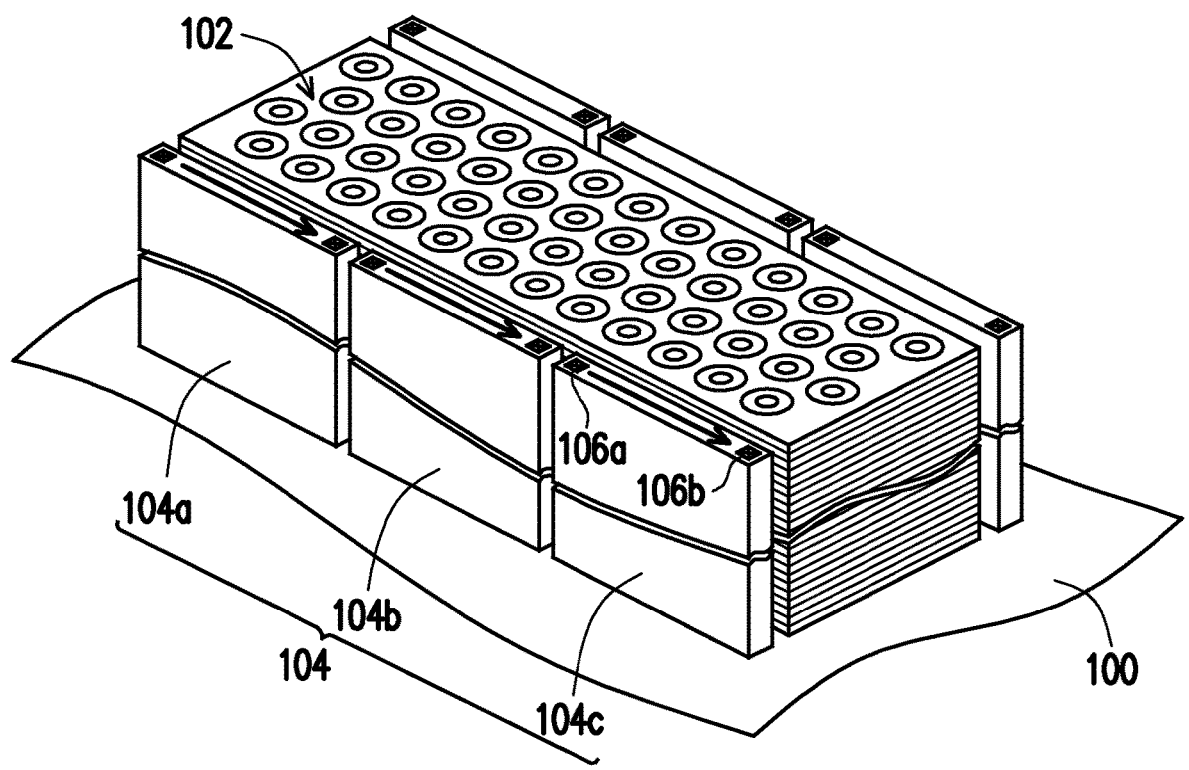
FIG. 2 is a three-dimensional schematic view of a 3D flash memory module according to another embodiment of the disclosure.

FIG. 2 is a three-dimensional schematic view of a 3D flash memory module according to another embodiment of the disclosure. In this embodiment, the elements identical to those of FIG. 1 are denoted with the same numerals and description thereof is not repeated.

With reference to FIG. 2, in this embodiment, the conductive layer 104 has a conductive portion 104a, a conductive portion 104b, and a conductive portion 104c separated from one another. The conductive portion 104a, the conductive portion 104b, and the conductive portion 104c are individually disposed on the substrate 100 along the side wall of the 3D flash memory structure 102. Two opposite end portions of each of the conductive portion 104a, the conductive portion 104b, and the conductive portion 104c respectively has an electrical connection point 106a and an electrical connection point 106b in the extending direction of the conductive layer 104. In this way, a length of each of the conductive portion 104a, the conductive portion 104b, and the conductive portion 104c is less than or equal to 50 µm, and in this way, the 3D flash memory structure 102 is prevented from being unevenly heated by the conductive layer 104 owing to excessive lengths of the conductive portions. In some embodiments, each of the conductive portions is less than or equal to 2 µm for better heating efficiency. In addition, the distance between the conductive portions 104a, 104b and 104c is preferably less than 20% of the length of these conductive portions. In this way, the heating effect can be effectively improved, and more uniform heating can be achieved. That is, if the length of the 3D flash memory structure 102 is relatively long, since the conductive layer 104 is divided into multiple conductive portions and the relatively high voltage and the relatively low voltage are applied to two opposite end portions of each of the conductive portions, a temperature distribution of the entire conductive layer 104 may be uniform when the 3D flash memory structure 102 is heated, and that the 3D flash memory structure 102 may be effectively healed.

In this embodiment, the conductive layer 104 has three conductive portions separated from one another, but a number of the conductive portions is not limited by the disclosure. In other embodiments, the conductive layer 104 may be configured to have two or more conductive portions according to layout design or heating demand.

In addition, when the healing operation is performed to the 3D flash memory structure 102, flowing directions of currents of the conductive portions may be identical to or may be different from one another, which is not limited by the disclosure.

In the foregoing embodiments, the 3D flash memory structure 102 is a 3D AND memory structure, but the disclosure is not limited thereto. In other embodiments, the 3D flash memory structure 102 may be a 3D NAND memory structure. In the case that the 3D flash memory structure 102 is a 3D NAND memory structure, the conductive layer 104 may be disposed on the substrate 100 and is electrically connected to the 3D NAND memory structure, so as to act as a heater as well as a source line of the 3D NAND memory structure. Furthermore, in one embodiment, the conductive portions of the conductive layer 104 as the heater and the source line around the 3D flash memory structure may be electrically connected to each other.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional (3D) flash memory module, comprising:
    a 3D flash memory structure, disposed on a substrate; and
    a conductive layer, disposed on the substrate and adjacent to at least one side wall of the 3D flash memory structure, wherein the conductive layer extends along the at least one side wall of the 3D flash memory structure, and each of two opposite end portions of the conductive layer has an electrical connection point in an extending direction of the conductive layer,
    wherein the 3D flash memory structure and the conductive layer are lateral arranged on the substrate.

2. The 3D flash memory module as claimed in claim 1, wherein the 3D flash memory structure is a 3D AND memory structure.

3. The 3D flash memory module as claimed in claim 2, wherein the conductive layer is not electrically connected to the 3D AND memory structure.

4. The 3D flash memory module as claimed in claim 1, wherein the 3D flash memory structure is a 3D NAND memory structure.

5. The 3D flash memory module as claimed in claim 4, wherein the conductive layer is electrically connected to a source of the 3D NAND memory structure.

6. The 3D flash memory module as claimed in claim 1, wherein the conductive layer comprises a plurality of discontinuous conductive portions, and the plurality of discontinuous conductive portions are individually disposed on the substrate along the at least one side wall of the 3D flash memory structure, wherein each of two opposite end portions of each of the conductive portions has an electrical connection point in the extending direction.

7. The 3D flash memory module as claimed in claim 6, wherein a length of each of the conductive portions is less than or equal to 50 µm.

8. The 3D flash memory module as claimed in claim 6, wherein a distance between the conductive portions is less than 20% of a length of the conductive portions.

9. The 3D flash memory module as claimed in claim 6, wherein the conductive portions around the 3D flash memory structure are electrically connected to each other.

10. The 3D flash memory module as claimed in claim 1, wherein the conductive layer comprises a metal layer.

11. The 3D flash memory module as claimed in claim 1, wherein the conductive layer comprises a tungsten layer.

12. A healing method of 3D flash memory, adapted for the 3D flash memory module as claimed in claim 1, the healing method of 3D flash memory comprising:
    applying a relatively high voltage and a relatively low voltage respectively to the electrical connection points of the two end portions of the conductive layer to form a voltage difference, wherein the temperature of the 3D flash memory structure is raised to a specific temperature by heat generated by the conductive layer owing to the voltage difference, wherein the specific temperature is above 700 K.

13. The healing method of 3D flash memory as claimed in claim 12, wherein the specific temperature is above 1000K.

14. The healing method of 3D flash memory as claimed in claim 12, wherein the voltage difference is 4 V or more.

15. An operating method of 3D flash memory, adapted for the 3D flash memory module as claimed in claim 5, the operating method of 3D flash memory comprising:
    applying a source voltage to the source by applying a voltage to the conductive layer when a program operation, a read operation or an erase operation is performed to the 3D flash memory structure, wherein the step of applying a voltage to the conductive layer comprises applying a relatively high voltage and a relatively low voltage respectively to the electrical connection points of the two end portions of the conductive layer.

16. The operating method of 3D flash memory as claimed in claim 15, wherein a voltage difference between the relatively high voltage and the relatively low voltage is 4 V or more.

* * * * *